(12) United States Patent
Yu et al.

(10) Patent No.: US 9,859,254 B1
(45) Date of Patent: Jan. 2, 2018

(54) SEMICONDUCTOR STRUCTURE AND A MANUFACTURING METHOD THEREOF

(71) Applicant: TAIWAN SEMICONDUCTOR MANUFACTURING COMPANY LTD., Hsinchu (TW)

(72) Inventors: Chen-Hua Yu, Hsinchu (TW); Sung-Feng Yeh, Taipei (TW); Ming-Fa Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/234,813

(22) Filed: Aug. 11, 2016

Related U.S. Application Data

(60) Provisional application No. 62/357,048, filed on Jun. 30, 2016.

(51) Int. Cl.
*H01L 25/065* (2006.01)
*H01L 25/00* (2006.01)
*H01L 23/00* (2006.01)

(52) U.S. Cl.
CPC .......... *H01L 25/0657* (2013.01); *H01L 24/02* (2013.01); *H01L 24/13* (2013.01); *H01L 24/83* (2013.01); *H01L 25/50* (2013.01); *H01L 2224/02372* (2013.01); *H01L 2224/02373* (2013.01); *H01L 2224/13* (2013.01); *H01L 2225/06527* (2013.01); *H01L 2225/06541* (2013.01)

(58) Field of Classification Search
CPC ..... H01L 24/13; H01L 24/83; H01L 25/0657; H01L 25/50
See application file for complete search history.

(56) References Cited

U.S. PATENT DOCUMENTS

| 8,361,842 | B2 | 1/2013 | Yu et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2008/0157316 | A1* | 7/2008 | Yang ............... H01L 24/24 257/685 |

(Continued)

*Primary Examiner* — Christine Enad
(74) *Attorney, Agent, or Firm* — WPAT, P.C. Intellectual Property Attorneys; Anthony King

(57) ABSTRACT

A semiconductor structure includes a substrate including a first surface, a second surface opposite to the first surface and a recess extending from the first surface towards the second surface, a first die at least partially disposed within the recess and including a first die substrate and a first bonding member disposed over the first die substrate, a second die disposed over the first die and including a second die substrate and a second bonding member disposed a second die substrate and the second die substrate, a redistribution layer (RDL) disposed over the second die, and a conductive bump disposed over the RDL, wherein the first bonding member is disposed opposite to and is bonded with the second bonding member.

20 Claims, 10 Drawing Sheets

(56) References Cited

U.S. PATENT DOCUMENTS

| | | | |
|---|---|---|---|
| 2008/0197469 A1* | 8/2008 | Yang | H01L 25/0652 257/686 |
| 2008/0217761 A1* | 9/2008 | Yang | H01L 24/82 257/700 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0130347 A1* | 5/2014 | Park | H05K 1/185 29/832 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

* cited by examiner

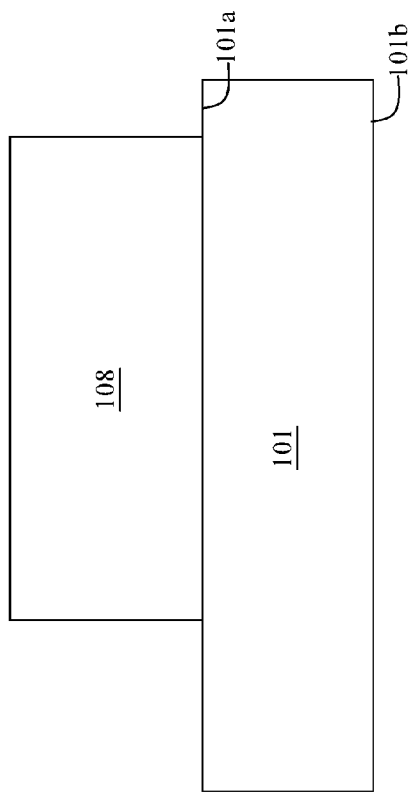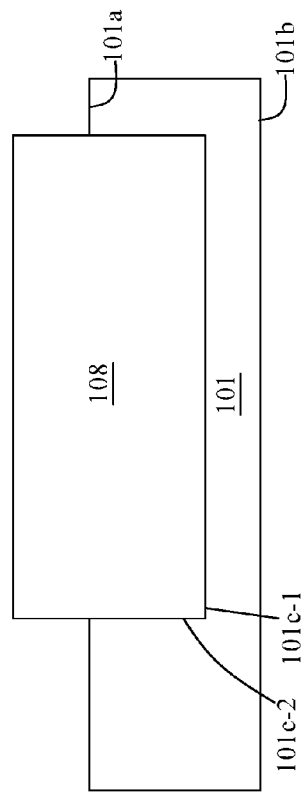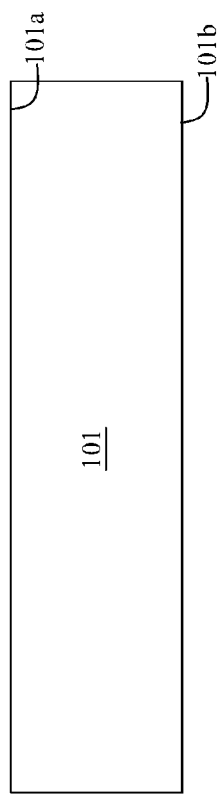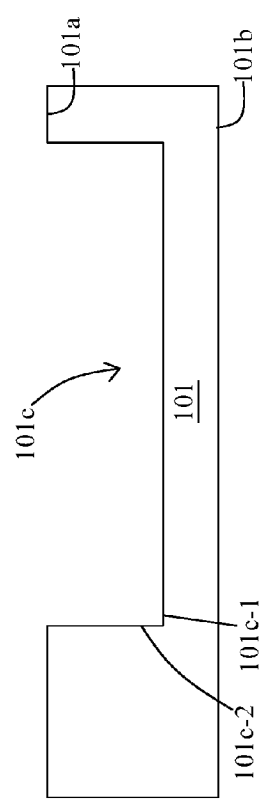
FIG. 4A
FIG. 4B
FIG. 4C
FIG. 4D

SEMICONDUCTOR STRUCTURE AND A MANUFACTURING METHOD THEREOF

PRIORITY CLAIM AND CROSS-REFERENCE

This application claims priority to U.S. Provisional Application Ser. No. 62/357,048, filed on Jun. 30, 2016, entitled "Semiconductor Structure and A Manufacturing Method Thereof," which application is hereby incorporated herein by reference.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components, inaccurate placement of components or other issues, resulting in a high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

The semiconductor device is assembled with numbers of integrated components. Since more different components are involved, a complexity of the manufacturing operations of the semiconductor device is increased. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-4K are schematic views of manufacturing a semiconductor structure by a method of FIG. 4 in accordance with some embodiments of the present disclosure.

DETAILED DESCRIPTION OF THE DISCLOSURE

Figure 1:
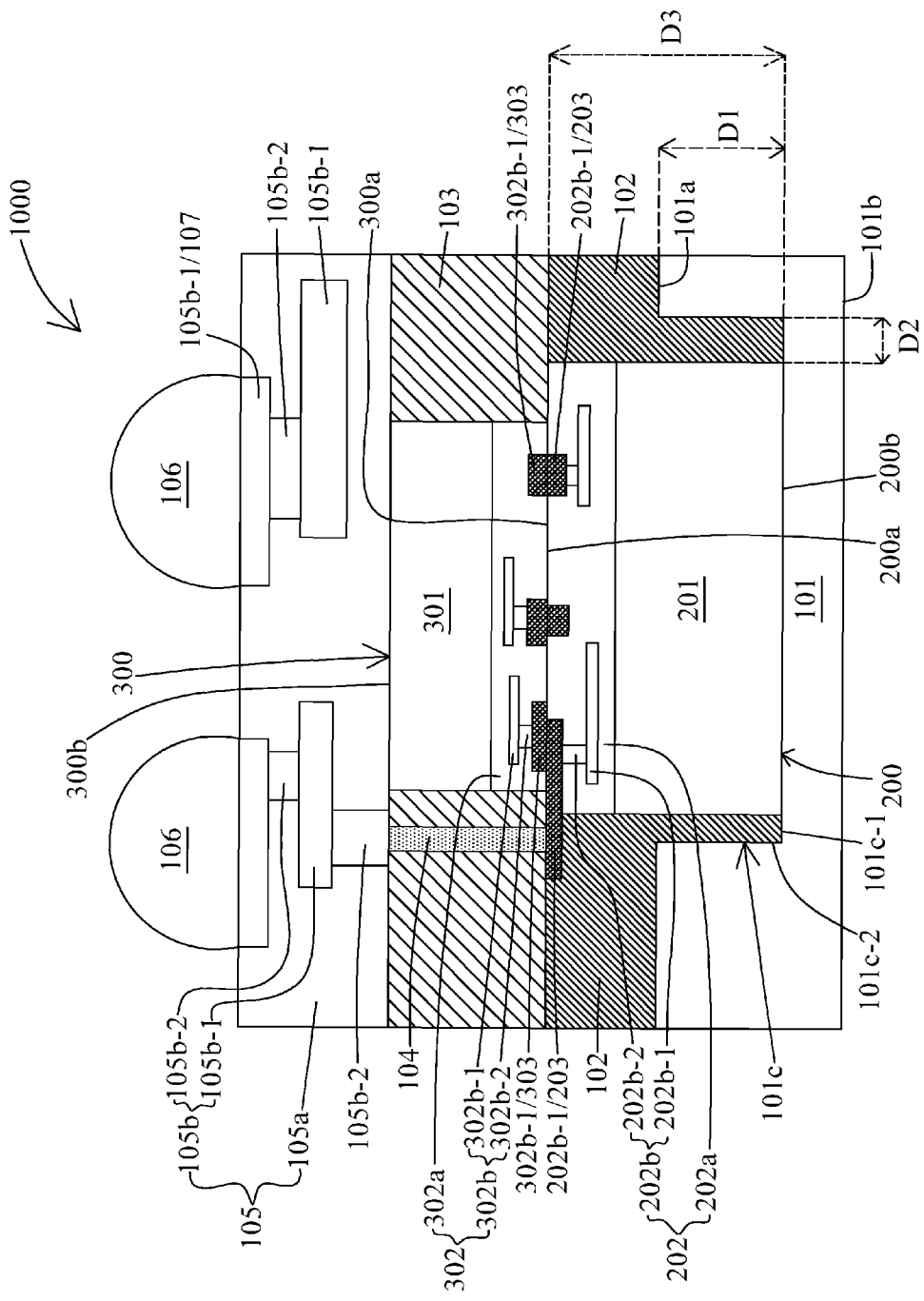
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is fabricated and singulated from a semiconductive wafer. After singulation, the die is packaged to become a semiconductor package and integrated with another die or package. The dies are encapsulated by a molding, and electrical connections between the dies such as microbumps are surrounded by an underfill. Such configuration of the semiconductor package involves different kinds of materials (e.g. the die, the molding, the underfill, the microbumps, etc.). An internal stress would be easily developed between materials during manufacturing. Further, the internal stress would weaken electrical connections between components, and ultimately results in failure of the semiconductor package.

The present disclosure is directed to a semiconductor structure including a substrate having a recess, a first die disposed at least partially within the recess, and a second die disposed over and bonded with the first die. A first bonding member disposed over the first die is bonded with a second bonding member disposed over the second die. Such direct bonding of the first die and the second die can reduce gaps between the first die and the second die, improve electrical connection between the first die and the second die, enhance signal transmission, or reduce stress in the semiconductor structure. Further, some components such as an underfill can be omitted, and a form factor of the semiconductor structure can be reduced. Other embodiments are also disclosed.

FIG. 1 is a schematic cross sectional view of a semiconductor structure 1000 in accordance with some embodiments of the present disclosure. In some embodiments, the semiconductor structure 1000 includes a substrate 101, a first die 200, a second die 300, a redistribution layer (RDL) 105 and a conductive bump 106. In some embodiments, the semiconductor structure 1000 is a semiconductor package. In some embodiments, the semiconductor structure 1000 is an integrated fan out (InFO) package, that I/O terminals of the first die 200 or the second die 300 are fanned out and redistributed over a surface of the substrate 101 in a greater area. In some embodiments, the semiconductor structure 1000 is a system in package (SIP) or a three dimensional (3D) integrated circuit (IC).

In some embodiments, the substrate 101 includes a first surface 101a, a second surface 101b opposite to the first surface 101a, and a recess 101c extending from the first surface 101a towards the second surface 101b. In some embodiments, the substrate 101 includes semiconductive materials such as silicon or other suitable materials. In some embodiments, the substrate 101 is a silicon substrate or silicon wafer. In some embodiments, the substrate 101 includes several circuitries and one or more active elements such as transistors etc. disposed over or in the substrate 101. In some embodiments, the first surface 101a of the substrate 101 is a front side of the substrate 101. In some embodiments, the second surface 101b is a back side of the substrate 101. In some embodiments, a thickness of the substrate 101 is about 500 um to 900 um. In some embodiments, the thickness of the substrate 101 is about 750 um to about 800 um.

In some embodiments, the recess 101c passes through a portion of the substrate 101. In some embodiments, the recess 101c is indented into the substrate 101. In some embodiments, the recess 101c includes a first sidewall 101c-1 and a second sidewall 101c-2. In some embodiments, the first sidewall 101c-1 is substantially orthogonal to the second sidewall 101c-2. In some embodiments, the first sidewall 101c-1 is a bottom sidewall of the recess 101c. In some embodiments, the recess 101c is extended through the substrate 101, such that the first sidewall 101c-1 is not present. In some embodiments, a height or a depth D1 of the recess 101c is about 20 um to about 60 um. In some embodiments, the depth D1 is about 40 um.

In some embodiments, the first die 200 is disposed over the substrate 101. In some embodiments, the first die 200 is at least partially disposed within the recess 101c of the substrate 101. In some embodiments, the first die 200 is surrounded by the recess 101c. In some embodiments, the first die 200 is at least partially surrounded by the substrate 101 or the second sidewall 101c-2 of the substrate 101. In some embodiments, a portion of the first die 200 is protruded into the recess 101c. In some embodiments, the first sidewall 101c-1 of the recess 101c is bonded with the first die 200.

In some embodiments, a distance D2 between a sidewall of the first die 200 and the second sidewall 101c-2 of the recess 101c is about 5 um to about 30 um. In some embodiments, the distance D2 is about 10 um to about 20 um. In some embodiments, a thickness D3 of the first die 200 is substantially greater than the depth D1 of the recess 101c. In some embodiments, the thickness D3 is about 30 um to about 70 um. In some embodiments, the thickness D3 is about 50 um. In some embodiments, a ratio of the distance D2 to the depth D1 is about 1:1.5 to about 1:3. In some embodiments, the ratio is smaller than or equal to about 1:2.

In some embodiments, the first die 200 is fabricated with a predetermined functional circuit within the first die 200. In some embodiments, the first die 200 is singulated from a semiconductive wafer by a mechanical or laser blade. In some embodiments, the first die 200 comprises a variety of electrical circuits suitable for a particular application. In some embodiments, the electrical circuits include various devices such as transistors, capacitors, resistors, diodes and/or the like. In some embodiments, the first die 200 comprises Dynamic Random Access Memory (DRAM), Static RAM (SRAM), High Bandwidth Memory (HBM) Microelectromechanical Systems (MEMS), Hybrid Memory Cube (HMC) or logic device.

In some embodiments, the first die 200 includes a first front surface 200a and a first back surface 200b opposite to the first front surface 200a. In some embodiments, the first front surface 200a is a front side of the first die 200. In some embodiments, the first back surface 200b is a back side of the first die 200. In some embodiments, several circuitries or electrical components are disposed over the first front surface 200a. In some embodiments, a portion of the first die 200 is exposed from the substrate 101 when the recess 101c extends through the substrate 101. In some embodiments, the first back surface 200b is exposed from the substrate 101 when the recess 101c extends through the substrate 101.

In some embodiments, the first die 200 includes a first die substrate 201 and a first die RDL 202 disposed over the first die substrate 201. In some embodiments, the first die substrate 201 includes semiconductive materials such as silicon or other suitable materials. In some embodiments, the first die substrate 201 is a silicon substrate. In some embodiments, the first die substrate 201 includes several circuitries and one or more active elements such as transistors etc. disposed over or in the first die substrate 201.

In some embodiments, the first die RDL 202 includes a first die dielectric 202a and a first die conductive structure 202b disposed within the first die dielectric 202a. In some embodiments, the first die dielectric 202a is disposed over the first die substrate 201. In some embodiments, the first die dielectric 202a includes dielectric material such as silicon oxide, silicon nitride, silicon carbide, silicon oxynitride or the like. In some embodiments, the first die conductive structure 202b is surrounded by and extended within the first die dielectric 202a. In some embodiments, the first die conductive structure 202b includes conductive material such as gold, silver, copper, nickel, tungsten, aluminum, palladium and/or alloys thereof. In some embodiments, the first die conductive structure 202b is electrically connected to a circuitry in the first die substrate 201.

In some embodiments, the first die conductive structure 202b includes a first die land portion 202b-1 and a first die via portion 202b-2 protruded from the first die land portion 202b-1. In some embodiments, the first die land portion 202b-1 is disposed over or surrounded by the first die dielectric 202a. In some embodiments, the first die land portion 202b-1 is extended horizontally within the first die dielectric 202a. In some embodiments, the first die land portion 202b-1 is electrically connected with the first die via portion 202b-2.

In some embodiments, the first die 200 includes a first bonding member 203 disposed over the first die 200. In some embodiments, the first bonding member 203 is disposed over the first front surface 200a of the first die 200. In some embodiments, the first bonding member 203 is a part of the first die conductive structure 202b. In some embodiments, the first bonding member 203 is the first die land portion 202b-1 or a portion of the first die land portion 202b-1. In some embodiments, the first bonding member 203 is extended into the first die dielectric 202a. In some embodiments, the first bonding member 203 is elongated over the first front surface 200a.

In some embodiments, a first dielectric material 102 is disposed over the substrate 101 and at least partially surrounds the first die 200. In some embodiments, the first dielectric material 102 is disposed within the recess 101c. In some embodiments, the first dielectric material 102 is disposed between the substrate 101 and the first die 200. In some embodiments, the first dielectric material 102 surrounds the first die substrate 201 and the first die dielectric 202a. In some embodiments, the first dielectric material 102 is disposed between a sidewall of the first die 200 and the second sidewall 101c-2 of the recess 101c. In some embodiments, the first dielectric material 102 fills a gap between the substrate 101 and the first die 200. In some embodiments, the first dielectric material 102 includes dielectric material such as silicon oxide, silicon nitride, silicon carbide, silicon oxynitride or the like. In some embodiments, the first dielectric material 102 includes same or different material from the first die dielectric 202a.

In some embodiments, the first bonding member 203 is elongated from the first die 200 towards the first dielectric material 102. In some embodiments, a portion of the first bonding member 203 is protruded into or is disposed within the first dielectric material 102. In some embodiments, a surface 102a of the first dielectric material 102 is substantially at the same level as the first front surface 200a of the first die 200. In some embodiments, a portion of the first bonding member 203 is disposed over the first dielectric material 102. In some embodiments, the first bonding member 203 is at least partially exposed from the first die dielectric 202a or the first dielectric material 102.

In some embodiments, the second die 300 is disposed over the first die 200. In some embodiments, the second die 300 is disposed over the first front surface 200a of the first die 200. In some embodiments, the second die 300 is fabricated with a predetermined functional circuit within the second die 300. In some embodiments, the second die 300 is singulated from a semiconductive wafer by a mechanical or laser blade. In some embodiments, the second die 300 comprises a variety of electrical circuits suitable for a particular application. In some embodiments, the electrical circuits include various devices such as transistors, capacitors, resistors, diodes and/or the like. In some embodiments, the second die 300 is a logic device die, central computing unit (CPU) die, transceiver die, or the like. In some embodiments, a thickness of the second die 300 is about 20 um to about 100 um.

In some embodiments, the second die 300 includes a second front surface 300a and a second back surface 300b opposite to the second front surface 300a. In some embodiments, the second front surface 300a is a front side of the second die 300. In some embodiments, the second back surface 300b is a back side of the second die 300. In some embodiments, several circuitries or electrical components are disposed over the second front surface 300a. In some embodiments, a length of the first front surface 200a is substantially greater than a length of the second front surface 300a.

In some embodiments, the second die 300 includes a second die substrate 301 and a second die RDL 302 disposed over the second die substrate 301. In some embodiments, the second die substrate 301 includes semiconductive materials such as silicon or other suitable materials. In some embodiments, the second die substrate 301 is a silicon substrate. In some embodiments, the second die substrate 301 includes several circuitries and one or more active elements such as transistors etc. disposed over or in the second die substrate 301. In some embodiments, a through silicon via (TSV) is disposed within and extended through the second die substrate 301.

In some embodiments, the second die RDL 302 includes a second die dielectric 302a and a second die conductive structure 302b disposed within the second die dielectric 302a. In some embodiments, the second die dielectric 302a is disposed over the second die substrate 301. In some embodiments, the second die dielectric 302a includes dielectric material such as silicon oxide, silicon nitride, silicon carbide, silicon oxynitride or the like. In some embodiments, the second die conductive structure 302b is surrounded by and extended within the second die dielectric 302a. In some embodiments, the second die conductive structure 302b includes conductive material such as gold, silver, copper, nickel, tungsten, aluminum, palladium and/or alloys thereof. In some embodiments, the second die conductive structure 302b is electrically connected to a circuitry in the second die substrate 301.

In some embodiments, the second die conductive structure 302b includes a second die land portion 302b-1 and a second die via portion 302b-2 protruded from the second die land portion 302b-1. In some embodiments, the second die land portion 302b-1 is disposed over or surrounded by the second die dielectric 302a. In some embodiments, the second die land portion 302b-1 is extended horizontally within the second die dielectric 302a. In some embodiments, the second die land portion 302b-1 is electrically connected with the second die via portion 302b-2.

In some embodiments, the second die 300 includes a second bonding member 303 disposed over the second die 300. In some embodiments, the second bonding member 303 is disposed opposite to the first bonding member 203. In some embodiments, the second bonding member 303 is disposed over the second front surface 300a of the second die 300. In some embodiments, the second bonding member 303 is a part of the second die conductive structure 302b. In some embodiments, the second bonding member 303 is the second die land portion 302b-1 or a portion of the second die land portion 302b-1. In some embodiments, the second bonding member 303 is elongated over the second front surface 300a. In some embodiments, the second bonding member 303 is at least partially exposed from the second die dielectric 302a.

In some embodiments, the second front surface 300a of the second die 300 is interfaced or bonded with the first front surface 200a of the first die 200. In some embodiments, the first bonding member 203 includes same or different material from the second bonding member 303. In some embodiments, the first bonding member 203 includes same conductive material as the second bonding member 303. In some embodiments, the first bonding member 203 is interfaced or bonded with the second bonding member 303. In some embodiments, the first die dielectric 202a is interfaced or bonded with the second die dielectric 302a. In some embodiments, a length of the first bonding member 203 is same or different from a length of the second bonding member 303.

In some embodiments, a second dielectric material 103 is disposed over the first dielectric material 102 and at least partially surrounds the second die 300. In some embodiments, the second dielectric material 103 surrounds the second die substrate 301 and the second die dielectric 302a. In some embodiments, a portion of the first front surface 200a is interfaced with the second dielectric material 103. In some embodiments, the second dielectric material 103 includes dielectric material such as silicon oxide, silicon nitride, silicon carbide, silicon oxynitride or the like. In some embodiments, the first dielectric material 102 includes same or different material from the second dielectric material 103. In some embodiments, the first dielectric material 102 is integral with the second dielectric material 103. In some embodiments, the first dielectric material 102 and the second dielectric material 103 are collectively as a dielectric material. In some embodiments, the second dielectric material 103 includes same or different material from the second die dielectric 302a. In some embodiments, the second bonding member 303 is exposed from the second dielectric material 103.

In some embodiments, a via 104 is extended within the second dielectric material 103. In some embodiments, the via 104 is electrically connected with and extended from the first bonding member 203. In some embodiments, the via 104 passes through at least a portion of the second dielectric material 103. In some embodiments, the via 104 is electrically connected to the first die 200 through the first bonding member 203 and the first die conductive structure 202b. In some embodiments, the via 104 is a through dielectric via (TDV). In some embodiments, the via 104 includes conductive material such as gold, silver, copper, nickel, tungsten, aluminum, palladium and/or alloys thereof.

In some embodiments, the RDL 105 is disposed over the second die 300 and the second dielectric material 103. In some embodiments, the via 104 is extended from the first bonding member 203 towards the RDL 105. In some embodiments, the RDL 105 includes a dielectric 105a and a conductive structure 105b disposed within the dielectric 105a. In some embodiments, the dielectric 105a is disposed over the second back surface 300b of the second die 300 and the second dielectric material 103. In some embodiments, the dielectric 105a includes dielectric material such as silicon oxide, silicon nitride, silicon carbide, silicon oxynitride or the like. In some embodiments, the conductive structure 105b is surrounded by and extended within the dielectric 105a. In some embodiments, the conductive structure 105b includes conductive material such as gold, silver, copper, nickel, tungsten, aluminum, palladium and/or alloys thereof. In some embodiments, the conductive structure 105b is electrically connected to the first die 200 or the second die 300 through the via 104, the first die conductive structure 202b or the second die conductive structure 302b. In some embodiments, the TSV disposed within the second die substrate 301 is electrically connected with the conductive structure 105b.

In some embodiments, the conductive structure 105b includes a land portion 105b-1 and a via portion 105b-2 protruded from the land portion 105b-1. In some embodiments, the land portion 105b-1 is extended horizontally within the dielectric 105a. In some embodiments, the land portion 105b-1 is electrically connected with the via portion 105b-2. In some embodiments, the via portion 105b-2 is disposed over and electrically connected with the via 104. In some embodiments, the via portion 105b-2 is a conductive plug.

In some embodiments, the land portion 105b-1 is at least partially exposed from the dielectric 105a. In some embodiments, the land portion 105b-1 is a pad 107 for receiving a conductive member. In some embodiments, the pad 107 is exposed from the dielectric 105a. In some embodiments, the pad 107 is configured to receive a conductive pillar or a conductive bump 106. In some embodiments, the pad 107 is an under bump metallization (UBM) pad. In some embodiments, the pad 107 is electrically connected to the first die 200 or the second die 300 through the conductive structure 105b.

In some embodiments, the conductive bump 106 is disposed over the RDL 105. In some embodiments, the conductive bump 106 is bonded with and electrically connected with the pad 107. In some embodiments, the conductive bump 106 includes conductive material such as includes solder, copper, nickel, gold or etc. In some embodiments, the conductive bump 106 is a solder ball, a ball grid array (BGA) ball, controlled collapse chip connection (C4) bump, a pillar or the like. In some embodiments, the conductive bump 106 is in a spherical, hemispherical or cylindrical shape.

Figure 2:
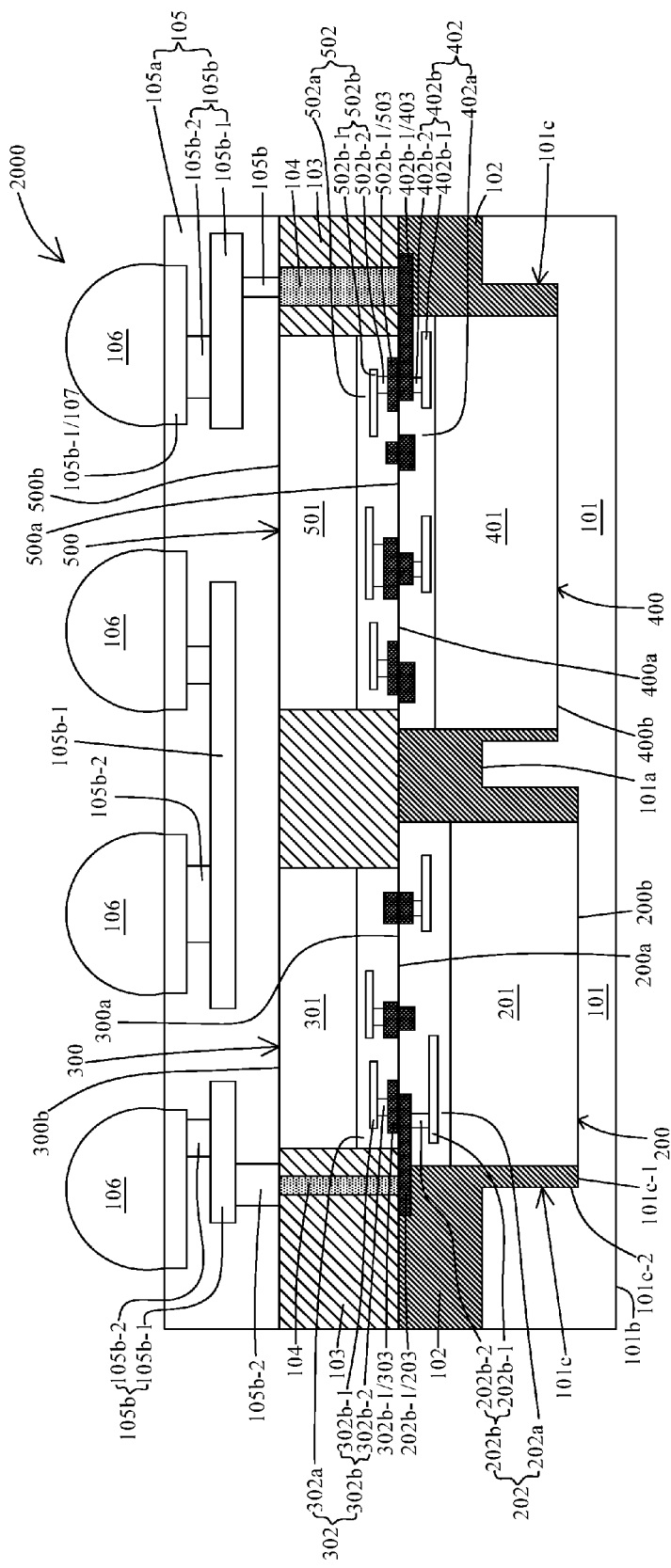
FIG. 2 is a schematic view of a semiconductor structure in accordance with some embodiments of the present disclosure.

FIG. 2 is a schematic cross sectional view of a semiconductor structure 2000 in accordance with some embodiments of the present disclosure. In some embodiments, the semiconductor structure 2000 is a semiconductor package. In some embodiments, the semiconductor structure 2000 is an integrated fan out (InFO) package. In some embodiments, the semiconductor structure 2000 is a system in package (SIP) or a three dimensional (3D) integrated circuit (IC).

In some embodiments, the semiconductor structure 2000 includes a substrate 101, a first die 200, a second die 300, a third die 400, a fourth die 500, a redistribution layer (RDL) 105 and a conductive bump 106. In some embodiments, the substrate 101, the first die 200, the second die 300, the RDL 105 and the conductive bump 106 have similar configuration as described above or illustrated in FIG. 1. In some embodiments, the first die 200 has similar configuration as the third die 400. In some embodiments as shown in FIG. 2, a thickness of the first die 200 is substantially greater than a thickness of the third die 400, and a depth of the recess 101c receiving the first die 200 is substantially greater than a depth of the recess 101c receiving the third die 400, such that a first front surface 200a of the first die 200 is at a level substantially the same as a third front surface 400a of the third die 400. In some embodiments, the substrate 101 including recesses 101c in different depths can compensate a thickness difference between dies (for example, the first die 200 and the third die 400) disposed in the recesses 101c. In some embodiments, the second die 300 has similar configuration as the fourth die 500. In some embodiments, the first die 200 has same or different size from the third die 400. In some embodiments, the second die 300 has same or different size from the fourth die 500.

In some embodiments, the second die 300 is disposed over and bonded with the first die 200, and the fourth die 500 is disposed over and bonded with the third die 400. In some embodiments, a third bonding member 403 of the third die 400 is interfaced or bonded with a fourth bonding member 503 of the fourth die 500. In some embodiments, a third die dielectric 402a of the third die 400 is interfaced or bonded with a fourth die dielectric 502a of the fourth die 500. In some embodiments, a via 104 is extended through a second dielectric material 103 and disposed over the third bonding member 403. In some embodiments, the first die 200 and the third die 400 are separated by a portion of the substrate 101. In some embodiments, the portion of the substrate 101 is disposed between the first die 200 and the third die 400. In some embodiments, the portion of the substrate 101 is surrounded by the first dielectric material 102.

Figure 3:
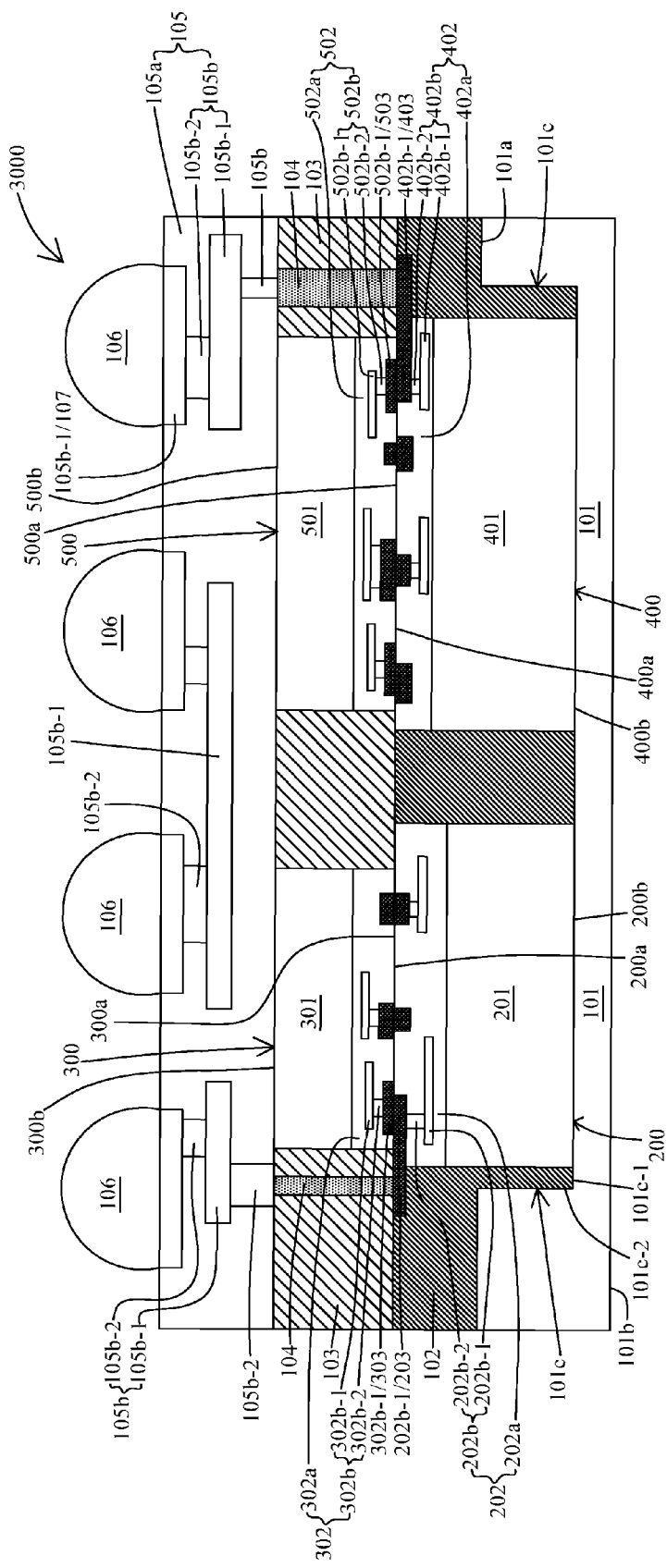
FIG. 3 is a schematic view of a semiconductor structure in accordance with some embodiments of the present disclosure.

FIG. 3 is a schematic cross sectional view of a semiconductor structure 3000 in accordance with some embodiments of the present disclosure. In some embodiments, the semiconductor structure 3000 has similar configuration as the semiconductor structure 1000 described above or illustrated in FIG. 2. In some embodiments, the first die 200 and the third die 400 are disposed in a recess 101c. In some embodiments, the first dielectric material 102 is disposed between the first die 200 and the third die 400.

Figure 4:
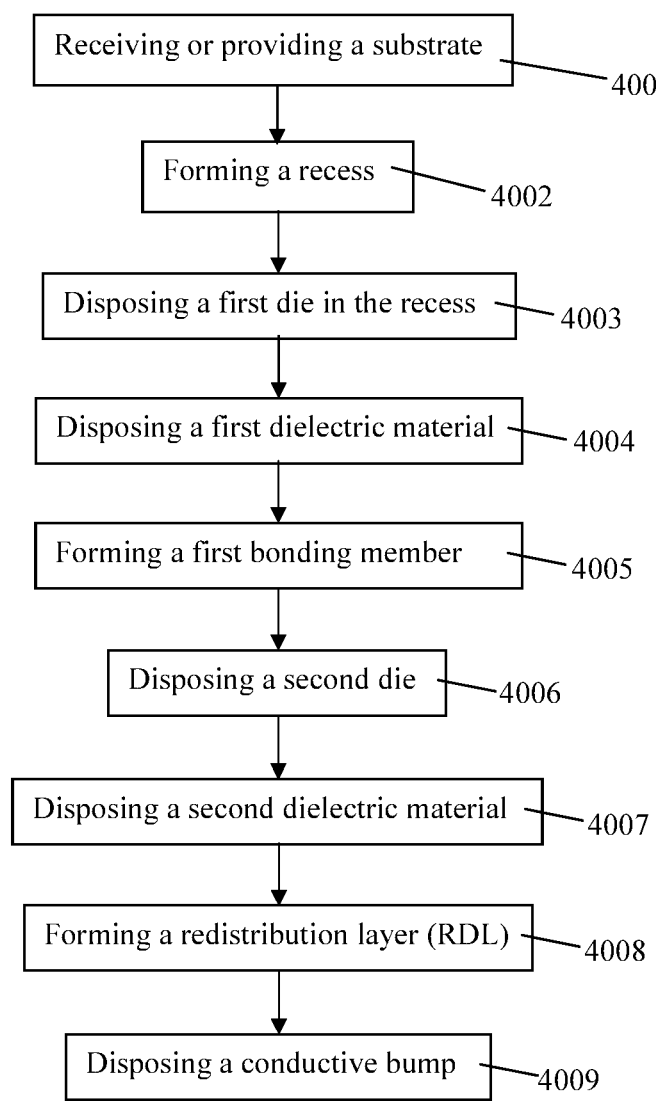
FIG. 4 is a flow diagram of a method of manufacturing a semiconductor structure in accordance with some embodiments of the present disclosure.

In the present disclosure, a method of manufacturing a semiconductor structure (1000, 2000 or 3000) is also disclosed. In some embodiments, a semiconductor structure (1000, 2000 or 3000) is formed by a method 4000. The method 4000 includes a number of operations and the description and illustration are not deemed as a limitation as the sequence of the operations. FIG. 4 is an embodiment of a method 4000 of manufacturing a semiconductor structure (1000, 2000 or 3000). The method 4000 includes a number of operations (4001, 4002, 4003, 4004, 4005, 4006, 4007, 4008 and 4009).

In operation 4001, a substrate 101 is received or provided as shown in FIG. 4A. In some embodiments, the substrate 101 includes semiconductive materials such as silicon or other suitable materials. In some embodiments, the substrate 101 is a silicon substrate or silicon wafer. In some embodiments, the substrate 101 includes several circuitries and one or more active elements such as transistors etc. disposed over or in the substrate 101. In some embodiments, the substrate 101 includes a first surface 101a and a second surface 101b opposite to the first surface 101a. In some embodiments, the first surface 101a of the substrate 101 is a front side of the substrate 101. In some embodiments, the second surface 101b is a back side of the substrate 101. In some embodiments, the substrate 101 has similar configuration as described above or illustrated in any one of FIGS. 1-3.

In operation 4002, a recess 101c is formed as shown in FIG. 4B. In some embodiments, the recess 101c is extended into the substrate 101. In some embodiments, the recess 101c is extended from the first surface 101a towards the second surface 101b. In some embodiments, a first sidewall 101c-1 and a second sidewall 101c-2 of the recess 101c are formed. In some embodiments, the recess 101c is formed by removing a portion of the substrate 101. In some embodiments, the portion of the substrate 101 is removed by photolithography and etching operations. In some embodiments, the recess 101c is formed by disposing a dummy die 108 over the substrate 101 as shown in FIG. 4C and then pressing the dummy die 108 into the substrate 101 as shown in FIG. 4D. In some embodiments, the dummy die 108 is removed after the disposing as shown in FIG. 4C and the pressing as shown in FIG. 4D, and then the recess 101c is formed as shown in FIG. 4B. In some embodiments, the recess 101c has similar configuration as described above or illustrated in any one of FIGS. 1-3.

Figure 4E:
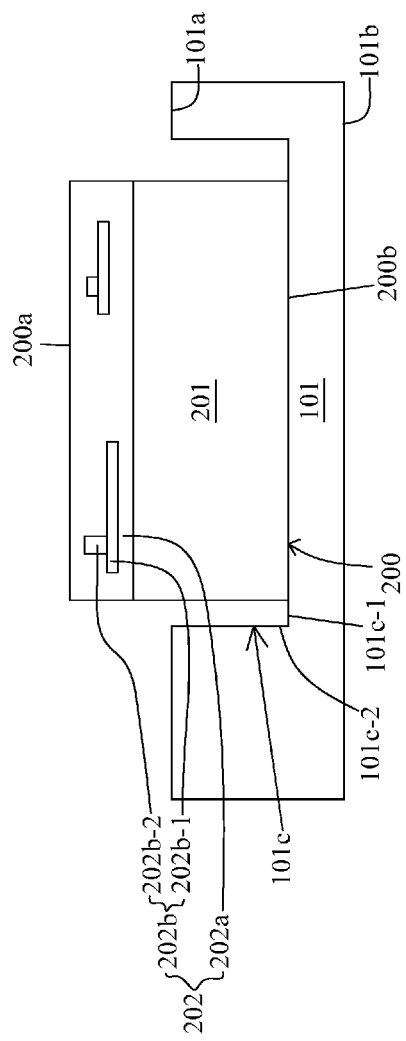

In operation 4003, a first die 200 is provided or received, and the first die 200 is disposed in the recess 101c as shown in FIG. 4E. In some embodiments, the first die 200 is at least partially disposed within the recess 101c. In some embodiments, the first die 200 includes a first die substrate 201, a first die RDL 202 disposed over the first die substrate 201, a first front surface 200a and a first back surface 200b opposite to the first front surface 200a. In some embodiments, the first back surface 200b of the first die 200 is interfaced or bonded with the first sidewall 101c-1 of the recess 101c. In some embodiments, the first die 200 is bonded with the substrate 101 by direct bonding, fusion bonding operations or any other suitable operations. In some embodiments, a bonding layer is disposed between the first back surface 200b and the first sidewall 101c-1. In some embodiments, the bonding layer is disposed over the first back surface 200b, and then bonded with the first sidewall 101c-1 of the recess 101c. In some embodiments, the bonding layer includes silicon oxide, silicon nitride or the like. In some embodiments, a portion of the first die 200 is protruded out of the recess 101c. In some embodiments, there is a gap between the second sidewall 101c-2 of the recess 101c and the first die 200. In some embodiments, the first die 200 has similar configuration as described above or illustrated in any one of FIGS. 1-3.

Figure 4F:
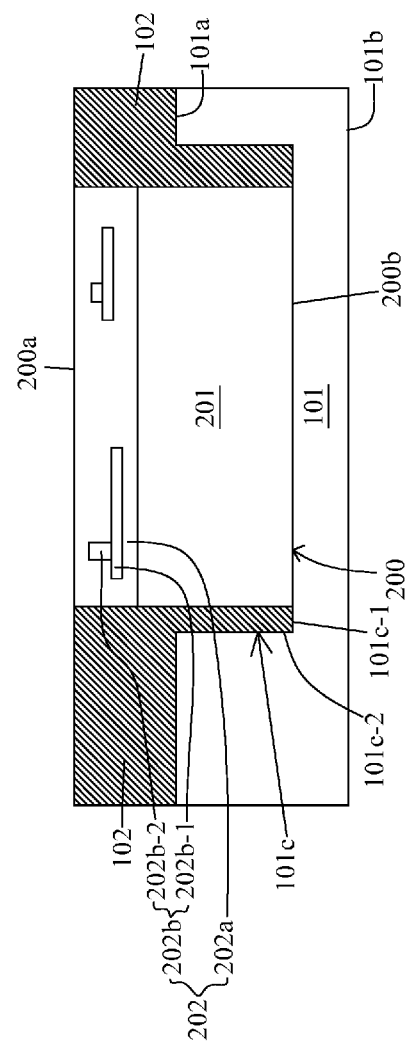

In operation 4004, a first dielectric material 102 is disposed as shown in FIG. 4F. In some embodiments, the first dielectric material 102 is disposed over the substrate 101 and within the recess 101c. In some embodiments, the first dielectric material 102 surrounds the first die 200. In some embodiments, the first dielectric material 102 fills a gap between the first die 200 and the substrate 101. In some embodiments, the first dielectric material 102 is disposed by chemical vapor deposition (CVD) operations, spin coating operation or any other suitable operations. In some embodiments, the first dielectric material 102 is planarized by planarization operations, chemical mechanical polish (CMP) operations or any other suitable operations. In some embodiments, the first dielectric material 102 includes dielectric material such as silicon oxide, silicon nitride, silicon carbide, silicon oxynitride or the like. In some embodiments, the first dielectric material 102 includes same or different material from a first die dielectric 202a of the first die RDL 202. In some embodiments, the first dielectric material 102 has similar configuration as described above or illustrated in any one of FIGS. 1-3.

Figure 4G:
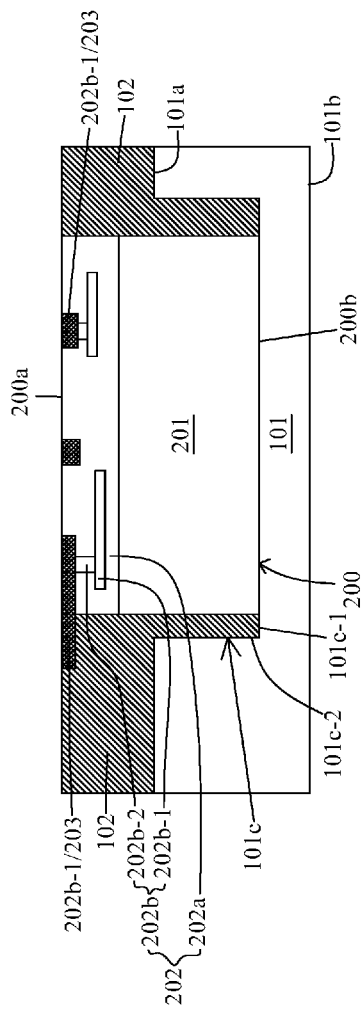

In operation 4005, a first bonding member (202b-1 or 203) is formed as shown in FIG. 4G. In some embodiments, the first bonding member (202b-1 or 203) is formed by removing a portion of the first die dielectric 202a or a portion of the first dielectric material 102 to form an opening, and then disposing a conductive material in the opening of the first dielectric material 102. In some embodiments, the portion of the first die dielectric 202a or the portion of the first dielectric material 102 is removed by photolithography and etching operations or any other suitable operations. In some embodiments, the conductive material is disposed by sputtering operations, electroplating operations or any other suitable operations.

In some embodiments, the first bonding member (202b-1 or 203) is disposed over the first front surface 200a of the first die 200. In some embodiments, the first bonding member (202b-1 or 203) is disposed over or within the first die dielectric 202a of the first die RDL 202. In some embodiments, the first bonding member (202b-1 or 203) is partially disposed over or within the first dielectric material 102. In some embodiments, the first bonding member (202b-1 or 203) is a part of a first die conductive structure 202b of the first die RDL 202. In some embodiments, the first bonding member (202b-1 or 203) is a first die land portion 202b-1 of the first die conductive structure 202b or a portion of the first die land portion 202b-1 of the first die conductive structure 202b. In some embodiments, the first bonding member (202b-1 or 203) is extended into the first die dielectric 202a. In some embodiments, the first bonding member (202b-1 or 203) is extended between the first die dielectric 202a and the first dielectric material 102. In some embodiments, the first bonding member (202b-1 or 203) is exposed from the first die dielectric 202a or the first dielectric material 102. In some embodiments, the first bonding member (202b-1 or 203) includes conductive material such as gold, silver, copper, nickel, tungsten, aluminum, palladium and/or alloys thereof. In some embodiments, the first bonding member (202*b*-1 or 203) has similar configuration as described above or illustrated in any one of FIGS. 1-3.

Figure 4H:
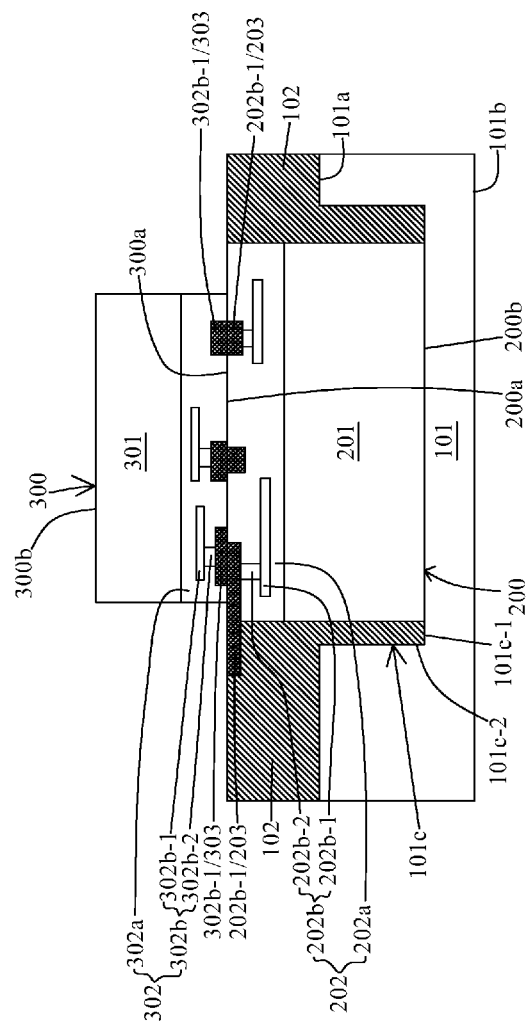

In operation 4006, a second die 300 is provided or received, and the second die 300 is disposed over the first die 200 as shown in FIG. 4H. In some embodiments, the second die 300 includes a second die substrate 301, a second die RDL 302 disposed over the second die substrate 301, a second front surface 300*a* and a second back surface 330*b* opposite to the second front surface 300*a*. In some embodiments, the second die 300 has similar configuration as described above or illustrated in any one of FIGS. 1-3. In some embodiments, a second bonding member (302*b*-1 or 303) is disposed over the second front surface 300*a*. In some embodiments, the second bonding member (302*b*-1 or 303) is disposed over or within a second die dielectric 302*a* of the second die RDL 302. In some embodiments, the second bonding member (302*b*-1 or 303) is at least partially exposed from the second die dielectric 302*a*. In some embodiments, the second bonding member (302*b*-1 or 303) is a part of a second die conductive structure 302*b* of the second die RDL 302. In some embodiments, the second bonding member (302*b*-1 or 303) includes conductive material such as gold, silver, copper, nickel, tungsten, aluminum, palladium and/or alloys thereof. In some embodiments, the second bonding member (302*b*-1 or 303) has similar configuration as described above or illustrated in any one of FIGS. 1-3.

In some embodiments, the second die 300 is interfaced or bonded with the first die 200. In some embodiments, the second front surface 300*a* of the second die 300 is interfaced or bonded with the first front surface 200*a* of the first die 200. In some embodiments, the second die 300 is bonded with the first die 200 by hybrid bonding operations or any other suitable operations. In some embodiments, the second die dielectric 302*a* is disposed opposite to the first die dielectric 202*a*. In some embodiments, the second bonding member (302*b*-1 or 303) is disposed opposite to the first bonding member (202*b*-1 or 203). In some embodiments, at least a portion of the second bonding member (302*b*-1 or 303) is interfaced or bonded with at least a portion of the first bonding member (202*b*-1 or 203). In some embodiments, at least a portion of the second die dielectric 302*a* is interfaced or bonded with at least a portion of the first die dielectric 202*a*. In some embodiments, the bonding of the first bonding member (202*b*-1 or 203) and the second bonding member (302*b*-1 or 303) and the bonding of the first die dielectric 202*a* and the second die dielectric 302*a* are performed simultaneously. In some embodiments, after the bonding of the first die 200 with the second die 300, the second die 300 is thinned down to reduce its thickness by thinning operations, grinding operations, etching operations or any other suitable operations. In some embodiments, a thickness of the second die substrate 301 is reduced to less than about 15 um.

Figure 4I:
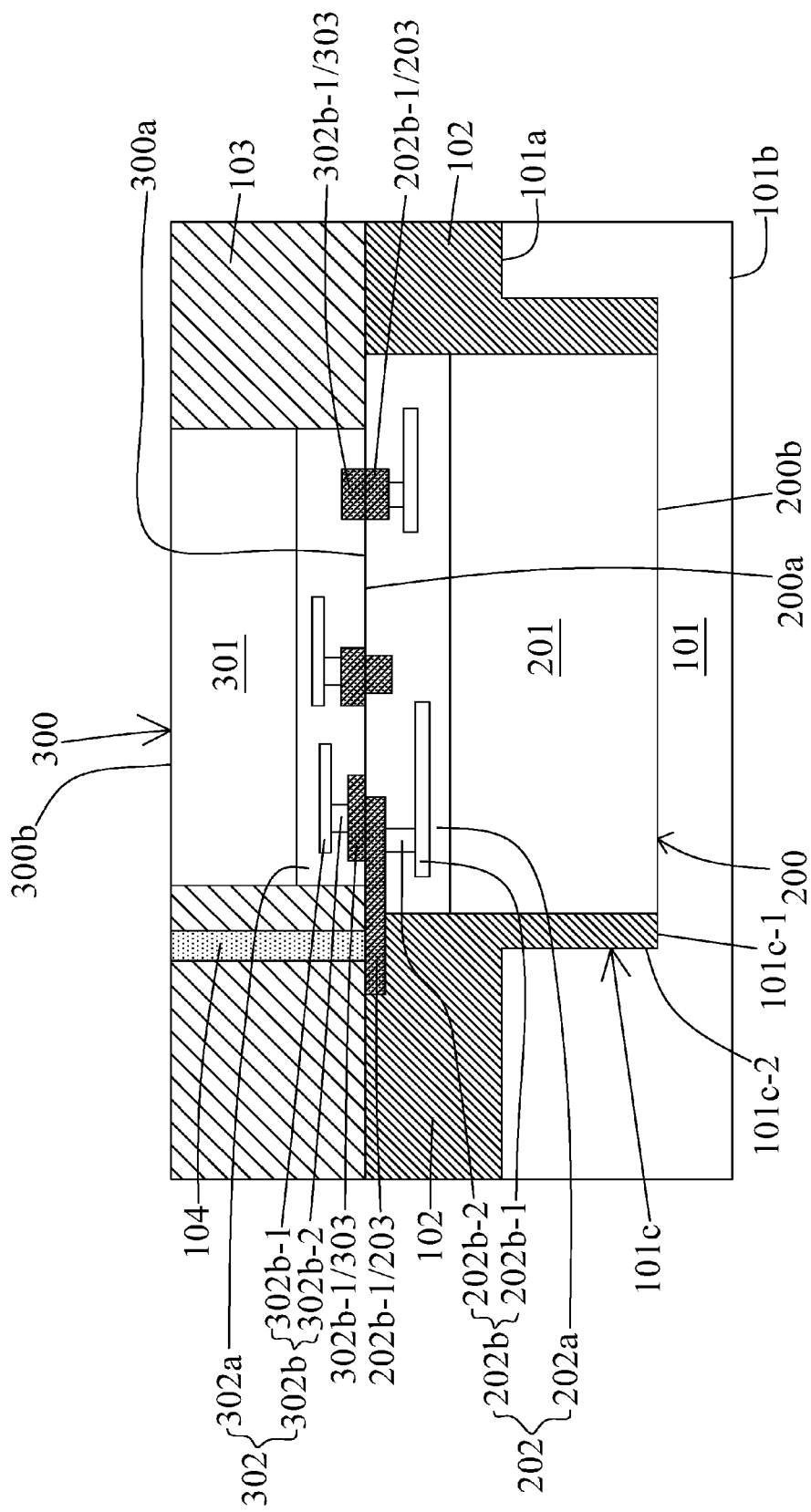

In operation 4007, a second dielectric material 103 is disposed as shown in FIG. 4I. In some embodiments, the second dielectric material 103 is disposed over the first dielectric material 102. In some embodiments, the second dielectric material 103 surrounds the second die 300. In some embodiments, the second bonding member 303 is exposed from the second dielectric material 103. In some embodiments, the second dielectric material 103 is interfaced with the first die dielectric 202*a* or the first bonding member 203. In some embodiments, the second dielectric material 103 is disposed by chemical vapor deposition (CVD) operations, spin coating operation or any other suitable operations. In some embodiments, the second dielectric material 103 is planarized by planarization operations, chemical mechanical polish (CMP) operations or any other suitable operations. In some embodiments, the second dielectric material 103 includes dielectric material such as silicon oxide, silicon nitride, silicon carbide, silicon oxynitride or the like. In some embodiments, the second dielectric material 103 includes same or different material from the first dielectric material 102. In some embodiments, the second dielectric material 103 has similar configuration as described above or illustrated in any one of FIGS. 1-3. In some embodiments, the operation 4004 and the operation 4007 are performed simultaneously, that the first dielectric material 102 and the second dielectric material 103 are integrally formed to surround the first die 200 and the second die 300.

In some embodiments, a via 104 is formed within the second dielectric material 103. In some embodiments, the via 104 is electrically connected with the first bonding member 203 and is extended through the second dielectric material 103. In some embodiments, the via 104 is formed by removing a portion of the second dielectric material 103 to form an opening passing through the second dielectric material 103, and disposing a conductive material in the opening of the second dielectric material 103. In some embodiments, the portion of the second dielectric material 103 is removed by photolithography and etching operations or any other suitable operations. In some embodiments, the conductive material is disposed by sputtering operations, electroplating operations or any other suitable operations. In some embodiments, the via 104 is a through dielectric via (TDV). In some embodiments, the via 104 includes conductive material such as gold, silver, copper, nickel, tungsten, aluminum, palladium and/or alloys thereof. In some embodiments, the via 104 has similar configuration as described above or illustrated in any one of FIGS. 1-3.

Figure 4J:
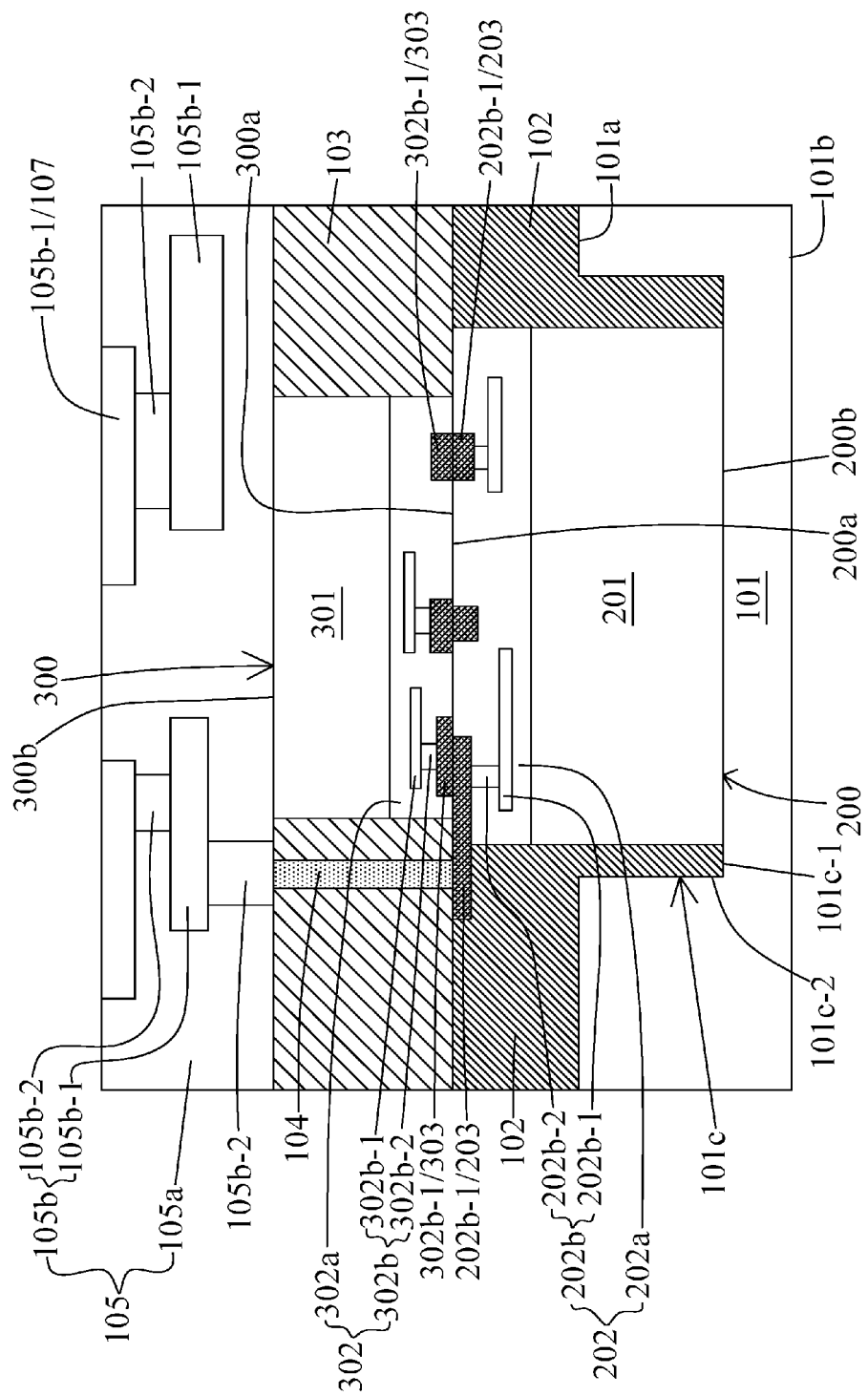

In operation 4008, a RDL 105 is formed as shown in FIG. 4J. In some embodiments, the RDL 105 is disposed over the second die 300 and the second dielectric material 103. In some embodiments, the RDL 105 is formed by disposing a dielectric 105*a* over the second die 300 and the second dielectric material 103, and forming a conductive structure 105*b* within the dielectric 105*a*. In some embodiments, the dielectric 105*a* is disposed by chemical vapor deposition (CVD) operations, spin coating operation or any other suitable operations. In some embodiments, the conductive structure 105*b* is formed by disposing a conductive material within the second dielectric material 103. In some embodiments, the conductive material is disposed by sputtering operations, electroplating operations or any other suitable operations. In some embodiments, the conductive structure 105*b* is electrically connected with the via 104, the first bonding member 203 or the first die conductive structure 202*b*. In some embodiments, the conductive structure 105*b* includes a pad 107 disposed over and exposed from the dielectric 105*a*. In some embodiments, the pad 107 is a part of the conductive structure 105*b*. In some embodiments, the RDL 105 has similar configuration as described above or illustrated in any one of FIGS. 1-3.

Figure 4K:
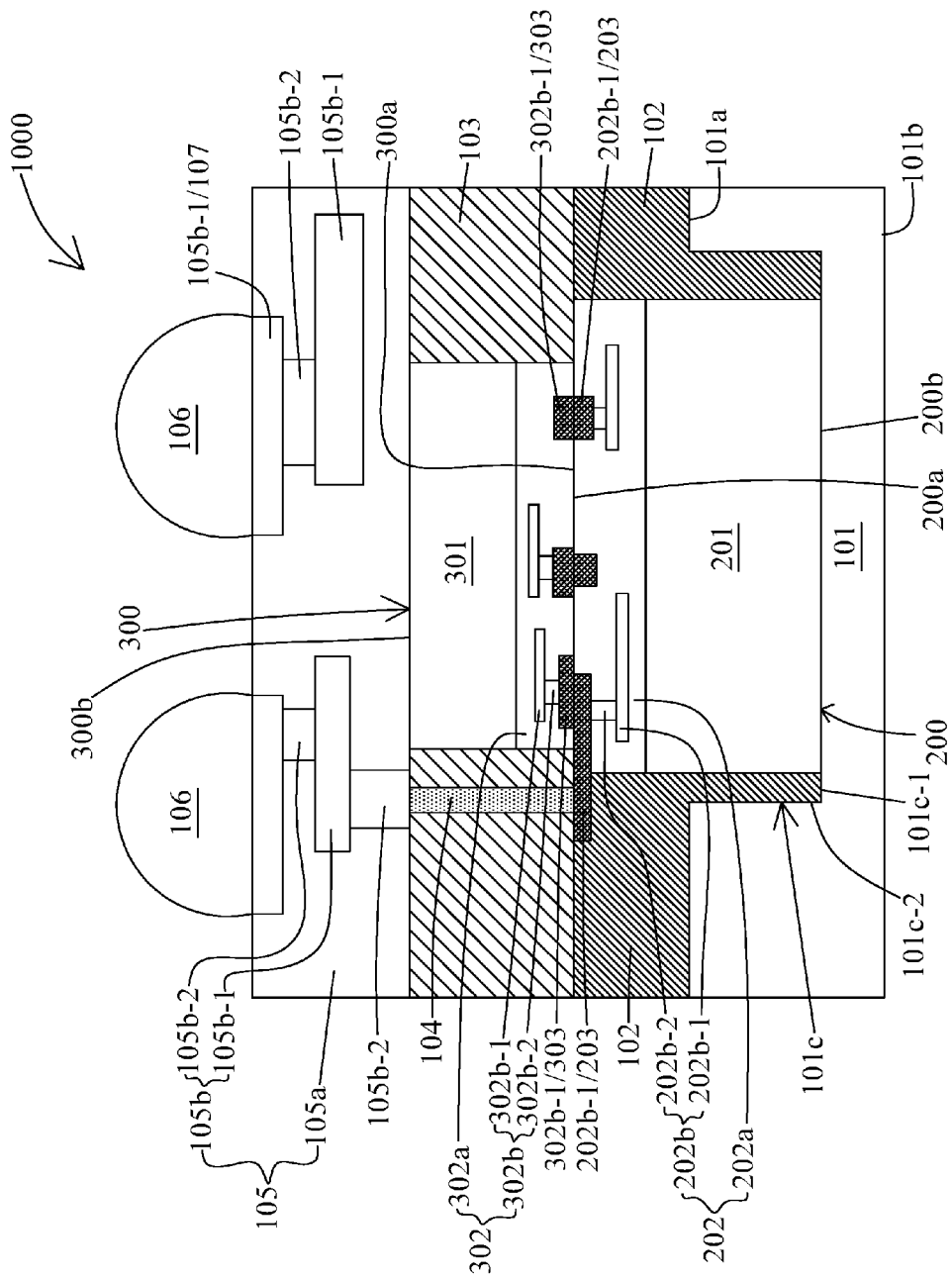

In operation 4009, a conductive bump 106 is disposed over the RDL 105 as shown in FIG. 4K. In some embodiments, the conductive bump 106 is disposed over and bonded with the pad 107. In some embodiments, the conductive bump 106 is disposed by ball dropping operations, solder pasting operations, stencil printing operations or any other suitable operations. In some embodiments, the conductive bump 106 has similar configuration as described above or illustrated in any one of FIGS. 1-3. In some embodiments, a semiconductor structure 1000 is formed as shown in FIG. 4K, which has similar configuration as the semiconductor structure 1000 as shown in FIG. 1. In some embodiments, the semiconductor structure 2000 and 3000 as shown in FIGS. 2 and 3 respectively can be similarly manufactured by the method 4000.

The present disclosure is directed to a semiconductor structure including, a substrate having a recess, a first die disposed at least partially within the recess, and a second die bonded with the first die by hybrid bonding operations. Such configuration can minimize gaps between the first die and the second die, improve electrical connection between the first die and the second die and reduce a form factor of the semiconductor structure.

In some embodiments, a semiconductor structure includes a substrate including a first surface, a second surface opposite to the first surface and a recess extending from the first surface towards the second surface, a first die at least partially disposed within the recess and including a first die substrate and a first bonding member disposed over the first die substrate, a second die disposed over the first die and including a second die substrate and a second bonding member disposed between the first die substrate and the second die substrate, a redistribution layer (RDL) disposed over the second die, and a conductive bump disposed over the RDL, wherein the first bonding member is disposed opposite to and is bonded with the second bonding member.

In some embodiments, the first die is bonded with a sidewall of the recess. In some embodiments, a thickness of the first die is substantially greater than a depth of the recess. In some embodiments, a portion of the first die is protruded from the recess. In some embodiments, the first die is at least partially surrounded by the substrate. In some embodiments, a distance between a sidewall of the first die and a sidewall of the recess is about 5 um to about 30 um. In some embodiments, a depth of the recess is about 20 um to about 60 um. In some embodiments, a thickness of the first die is about 30 um to about 70 um. In some embodiments, the semiconductor structure further includes a dielectric material disposed within the recess and surrounding the first die or the second die. In some embodiments, the dielectric material is disposed between the substrate and the RDL. In some embodiments, the semiconductor structure further includes a via extending from the first bonding member towards the RDL and passing through a portion of the dielectric material. In some embodiments, the first bonding member is elongated from the first die towards the dielectric material. In some embodiments, a portion of the first bonding member is protruded into or is disposed within the dielectric material.

In some embodiments, a semiconductor structure includes a substrate including a recess extending into the substrate, a first die surrounded by the recess, and including a first front surface, a first back surface opposite to the first front surface and interfaced with a sidewall of the recess, and a first bonding member disposed over the first front surface, a second die disposed over the first die, and including a second front surface interfaced with the first front surface, a second back surface opposite to the second front surface and a second bonding member disposed over the second front surface, and a dielectric material disposed within the recess and surrounding the first die and the second die, wherein the first bonding member is interfaced with the second bonding member.

In some embodiments, the first die is surrounded by the substrate. In some embodiments, a length of the first front surface is substantially greater than a length of the second front surface, or the first front surface is interfaced with the dielectric material. In some embodiments, the first back surface is exposed from the substrate.

In some embodiments, a method of manufacturing a semiconductor structure includes receiving a substrate, forming a recess extending into the substrate, disposing a first die at least partially within the recess, disposing a first dielectric material over the substrate and within the recess to surround the first die, disposing a second die over the first die, disposing a second dielectric material over the first dielectric material to surround the second die, wherein the first die includes a first bonding member surrounded by the first dielectric material, the second die includes a second bonding member disposed opposite to the first bonding member and surrounded by the second dielectric material, the first bonding member is bonded with the second bonding member.

In some embodiments, the recess is formed by removing a portion of the substrate, or disposing a dummy die over the substrate, pressing the dummy die into the substrate and removing the dummy die from the substrate. In some embodiments, the disposing the first dielectric material includes filling a gap between the substrate and the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate including a first surface, a second surface opposite to the first surface and a recess extending from the first surface towards the second surface;
   a first die at least partially disposed within the recess and including a first front surface, a first die substrate and a first bonding member disposed over the first front surface;
   a second die disposed over the first die and including a second front surface, a second die substrate and a second bonding member disposed over the second front surface;
   a redistribution layer (RDL) disposed over the second die; and
   a conductive bump disposed over the RDL,
   wherein the first bonding member is disposed opposite to and is bonded with the second bonding member, and the first front surface of the first die is interfaced with the second front surface of the second die.

2. The semiconductor structure of claim 1, wherein the first die is bonded with a sidewall of the recess.

3. The semiconductor structure of claim 1, wherein a thickness of the first die is substantially greater than a depth of the recess.

4. The semiconductor structure of claim 1, wherein a portion of the first die is protruded from the recess.

5. The semiconductor structure of claim 1, wherein the first die is at least partially surrounded by the substrate.

6. The semiconductor structure of claim 1, wherein a distance between a sidewall of the first die and a sidewall of the recess is about 5 um to about 30 um.

7. The semiconductor structure of claim 1, wherein a depth of the recess is about 20 um to about 60 um.

8. The semiconductor structure of claim 1, wherein a thickness of the first die is about 30 um to about 70 um.

9. The semiconductor structure of claim 1, further comprising a dielectric material disposed within the recess and surrounding the first die or the second die.

10. The semiconductor structure of claim 9, wherein the dielectric material is disposed between the substrate and the RDL.

11. The semiconductor structure of claim 9, further comprising a via extending from the first bonding member towards the RDL and passing through a portion of the dielectric material.

12. The semiconductor structure of claim 9, wherein the first bonding member is elongated from the first die towards the dielectric material.

13. The semiconductor structure of claim 9, wherein a portion of the first bonding member is protruded into or is disposed within the dielectric material.

14. A semiconductor structure, comprising:
   a substrate including a recess extending into the substrate;
   a first die surrounded by the recess, and including a first front surface, a first back surface opposite to the first front surface and interfaced with a bottom sidewall of the recess, and a first bonding member disposed over the first front surface;
   a second die disposed over the first die, and including a second front surface interfaced with the first front surface, a second back surface opposite to the second front surface and a second bonding member disposed over the second front surface; and
   a dielectric material disposed within the recess and surrounding the first die and the second die,
wherein the first bonding member is interfaced with the second bonding member.

15. The semiconductor structure of claim 14, wherein the first die is surrounded by the substrate.

16. The semiconductor structure of claim 14, wherein a length of the first front surface is substantially greater than a length of the second front surface, or the first front surface is interfaced with the dielectric material.

17. The semiconductor structure of claim 14, wherein the first back surface is exposed from the substrate.

18. A method of manufacturing a semiconductor structure, comprising:
   receiving a substrate;
   forming a recess extending into the substrate;
   disposing a first die at least partially within the recess and including a first front surface;
   disposing a first dielectric material over the substrate and within the recess to surround the first die;
   disposing a second die over the first die and including a second front surface interfaced with the first front surface;
   disposing a second dielectric material over the first dielectric material to surround the second die,
wherein the first die includes a first bonding member surrounded by the first dielectric material, the second die includes a second bonding member disposed opposite to the first bonding member and surrounded by the second dielectric material, the first bonding member is bonded with the second bonding member.

19. The method of claim 18, wherein the recess is formed by removing a portion of the substrate, or disposing a dummy die over the substrate, pressing the dummy die into the substrate and removing the dummy die from the substrate.

20. The method of claim 18, wherein the disposing the first dielectric material includes filling a gap between the substrate and the first die.

* * * * *